US008443314B1

(12) United States Patent
El-Zein et al.

(10) Patent No.: US 8,443,314 B1
(45) Date of Patent: May 14, 2013

(54) ABSTRACTION LEVEL-PRESERVING CONVERSION OF FLIP-FLOP-INFERRED HARDWARE DESCRIPTION LANGUAGE (HDL) TO INSTANTIATED HDL

(75) Inventors: Ali S. El-Zein, Austin, TX (US);
Wolfgang Roesner, Austin, TX (US);
Robert J. Shadowen, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/403,388

(22) Filed: Feb. 23, 2012

(51) Int. Cl.
*G06F 17/50* (2006.01)

(52) U.S. Cl.
USPC .......................................................... 716/104

(58) Field of Classification Search .................... 716/104
See application file for complete search history.

(56) References Cited

U.S. PATENT DOCUMENTS

| | | | |
|---|---|---|---|
| 5,537,580 | A | 7/1996 | Giomi et al. |
| 5,752,000 | A | 5/1998 | McGeer et al. |
| 5,774,370 | A | 6/1998 | Giomi et al. |
| 6,077,305 | A | 6/2000 | Cheng et al. |
| 6,370,495 | B1 | 4/2002 | Weddle et al. |
| 6,698,001 | B2 | 2/2004 | Bae |
| 6,836,877 | B1 | 12/2004 | Dupenloup |
| 6,931,611 | B2 | 8/2005 | Martin et al. |
| 7,310,790 | B2 | 12/2007 | Melham et al. |
| 7,380,222 | B2 | 5/2008 | Baumgartner et al. |
| 7,428,712 | B1 | 9/2008 | Singh et al. |
| 7,464,015 | B2 | 12/2008 | Iwashita |
| 7,475,370 | B2 | 1/2009 | Baumgartner et al. |
| 2008/0295043 | A1* | 11/2008 | Chang et al. ................. 716/3 |
| 2010/0042965 | A1 | 2/2010 | Baumgartner et al. |
| 2010/0185993 | A1 | 7/2010 | Baumgartner et al. |
| 2010/0251199 | A1 | 9/2010 | Baumgartner et al. |
| 2010/0293513 | A1 | 11/2010 | Baumgartner et al. |
| 2011/0093824 | A1 | 4/2011 | Baumgartner et al. |
| 2011/0093825 | A1 | 4/2011 | Baumgartner et al. |

OTHER PUBLICATIONS

Case, et al., "Enhanced Verification by Temporal Decomposition", Formal Methods in Computer-Aided Design (FMCAD) Conference, Nov. 2009, Austin TX.
Wilson, et al., "Reliable Verification Using Symbolic Simulation with Scalar Values", Design Automation Conference (DAC) Jun. 2000, pp. 124-129, Los Angeles, CA.
Cheng, Adriel, "Symbolic Trajectory Evaluation (STE)", website, page downloaded from http://www.eleceng.adelaide.edu.au/personal/acheng/public/ste/ste.html on Apr. 21, 2011.
Velev, et al., "Efficient Modeling of Memory Arrays in Symbolic Ternary Simulation", TACAS '98 Portugal, Mar. 1998.

* cited by examiner

*Primary Examiner* — Suresh Memula
(74) *Attorney, Agent, or Firm* — Mitch Harris, Atty at Law, LLC; Andrew M. Harris; Matthew W. Baca

(57) ABSTRACT

A logic design and synthesis program, method and system provides intelligibility and independence of separate blocks in digital logic designs at the synthesis level. The sequential and combinational logic are separated and the sequential logic is then mapped to flip-flop library components. State-retaining elements, i.e., flip-flops detected in the input hardware description language (HDL) are represented in the sequential logic HDL output. The combinational logic HDL and the sequential logic HDL are connected only by signals, so signals are introduced to represent the flip-flop signals and variables detected in the input HDL. The sequential and combinational logic HDL are then synthesized to produce the design.

21 Claims, 5 Drawing Sheets

ABSTRACTION LEVEL-PRESERVING CONVERSION OF FLIP-FLOP-INFERRED HARDWARE DESCRIPTION LANGUAGE (HDL) TO INSTANTIATED HDL

BACKGROUND OF THE INVENTION

1. Field of the Invention

The present invention is related to circuit design and synthesis, and in particular, to techniques that preserve intelligibility by retaining abstraction while instantiating hardware description language (HDL) into a design.

2. Description of Related Art

When designing and implementing digital circuits in HDL, e.g., in such circuit representation languages as VHSIC (Very High Speed Integrated Circuit) Hardware Description Language (VHDL) or VERILOG (a trademark of Gateway Design Automation Corporation), when sequential logic is instantiated at circuit synthesis, the links between the abstract source HDL and the resulting synthesized circuit is difficult or impossible to comprehend.

In many designs, individual modules may be managed by different designers or groups, and are generally updated or redesigned in different phases and possibly in different steppings. In particular, design-for-test (DFT) functionality requires logic that is added to a design that may or may not play a role in operation of the digital circuit, but is provided for testing of the design and/or the individual devices. Integration of DFT with functional logic is one example of a design process in which independence of module redesign/replacement is desirable. Further, the DFT may not be easily implemented with high level abstract representations, since the clock sources may be different and DFT circuits typically include such features as clock gating and power management circuits. Further, if the DFT circuits are synthesized with the functional logic, the resulting synthesized circuit cannot be easily mapped to the input HDL so that the functional logic and the DFT logic are separately recognizable.

Solutions to the above-described integration problem have included hard-coding the DFT circuits in the HDL, but such implementations are limited to a particular subset of the HDL, since, as noted above, flip-flops in circuit blocks such as scan chains must be instantiated and not inferred, since their clock source is not the same as for state machines implemented in the functional logic blocks. In this solution, a change made to the particular implementation of the DFT circuits requires a rewrite of the HDL, since the DFT design is hard-coded. Another solution has been to insert the DFT functionality at synthesis time, which, while preserving the independents of the DFT circuits, eliminates the ability to verify the DFT design at register transfer level (RTL), as the HDL does not contain the DFT circuits.

Therefore, an alternative circuit design and synthesis technique is desired.

BRIEF SUMMARY OF THE INVENTION

The invention is embodied in a computer-performed method, computer system and computer program product that synthesize a circuit design from HDL by separating the combinational and sequential logic and then mapping the sequential logic to flip-flop library components. The computer system is a computer system executing program instructions for carrying out the method and the computer program product is a program for carrying out the method.

The method parses an input HDL to generate separate combinational and sequential logic HDL output. In particular embodiments of the invention, flip-flops detected in the input HDL are replaced with representations according to whether the flip-flops are signals or variables, and whether a statement in HDL references or assigns to the flip-flop signal or variable. The resulting HDL files are then synthesized to generate the circuit design.

The foregoing and other objectives, features, and advantages of the invention will be apparent from the following, more particular, description of the preferred embodiment of the invention, as illustrated in the accompanying drawings.

BRIEF DESCRIPTION OF THE SEVERAL VIEWS OF THE DRAWING

The novel features believed characteristic of the invention are set forth in the appended claims. The invention itself, however, as well as a preferred mode of use, further objectives, and advantages thereof, will best be understood by reference to the following detailed description of the invention when read in conjunction with the accompanying Figures, wherein like reference numerals indicate like components, and:

DETAILED DESCRIPTION OF THE INVENTION

The present invention encompasses computer-performed methods and programs for designing and verifying digital logic circuits that separates the state-retaining elements (e.g., flip-flops) into one or more separate hardware description language (HDL) processes. The clocking and asynchronous set/reset applied to the flip-flops is extracted from a source HDL file and placed in a separate HDL filed used to represent the sequential logic portion of the design. The source HDL file is then processed to yield a combinatorial process output HDL file by transforming the flip-flop references and assignments in the input HDL to signal representations. By segregating the state-retaining elements, the output HDL can be more readily understood and during the synthesis process the flip-flops can be mapped to flip-flop library elements that are identifiable as directly related to the input HDL. The resulting design facilitates merging of separately-maintained circuit designs, and in particular, merging of designs not forming part of a same sequential machine, for example, as when merging design-for-test (DFT) elements such as scan latches and control, with processor core functional logic.

Figure 1:
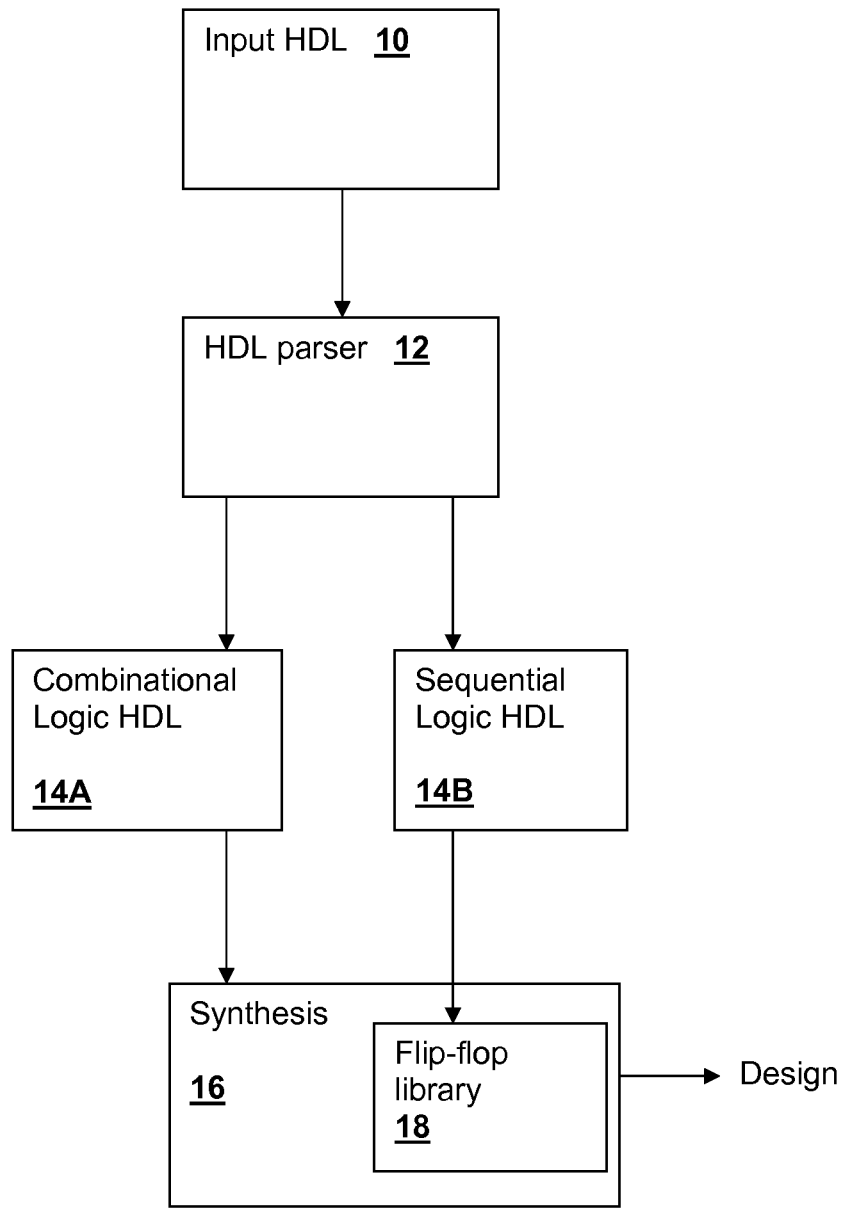
FIG. 1 is a is a pictorial diagram depicting information flow in embodiments of the present invention.

Referring now to FIG. 1, a technique for implementing a logic design in accordance with an embodiment of the present invention is shown. The technique is a method performed by a computer system that processes input HDL 10 that specifies a logic design, which may be embodied in a computer program stored on a computer readable storage medium. A VHSIC (Very High Speed Integrated Circuit) Hardware Description Language (VHDL). An HDL parser 12 detects state-retaining elements in an HDL design and when a state-retaining element is encountered, a representation of the element is placed in a sequential logic HDL code 14B that is used to segregate the storage elements, e.g., flip-flops, from the remainder of the logic, which is placed in a combinational logic HDL code 14A. During synthesis 16 the state-retaining elements in the sequential logic HDL code 14B are mapped to instances flip-flop library elements 18 and the rest of the logic is synthesized in combination with the flip-flop instances.

Figure 2:
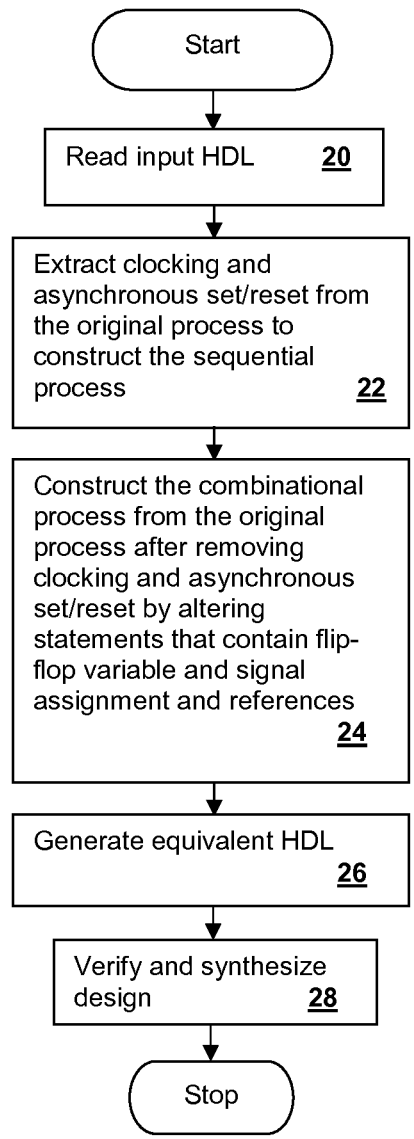
FIG. 2 is a flow chart depicting a method in accordance with an embodiment of the present invention.

Referring now to FIG. 2, a method of processing an HDL logic design is shown, according to an embodiment of the invention. The depicted method reads the input HDL (step 20), extracts all of the clocking and asynchronous set and/or reset control statements from the input HDL and places them in to a sequential process (step 22). The method then constructs the combinational process from the original process after performing step 22, by altering the statements that contain references or assignments to flip-flop variables or flip-flop statements (step 24). An equivalent HDL description is generated (step 26) and the resulting design is verified and/or synthesized (step 28). The HDL in the example is a behavioral model that abstracts any structural elements and specifies a design in terms of its behavior. Therefore storage elements such as flip-flops are inferred rather than being explicit, and the distinction between signals and variables are that variables are internal to a process, while signals are visible to other processes and can be included in a list that specifies the signals for which a change in status comprises an event that causes the state of other signals and variables to be re-evaluated.

In order to generate the combinational process, it is first necessary to determine which symbols (e.g., variables or signals) in the input HDL correspond to state-retaining elements, i.e., those elements that have memory, e.g., flip-flops, and which symbols correspond to wires, i.e. non-state retaining elements. Once the state-retaining elements have been identified, the sequential process can be constructed as noted above for step 22. Then, the combinational process can be generated as noted above for step 24, which, may be performed by the process described in further detail below with reference to FIG. 3.

Figure 3:
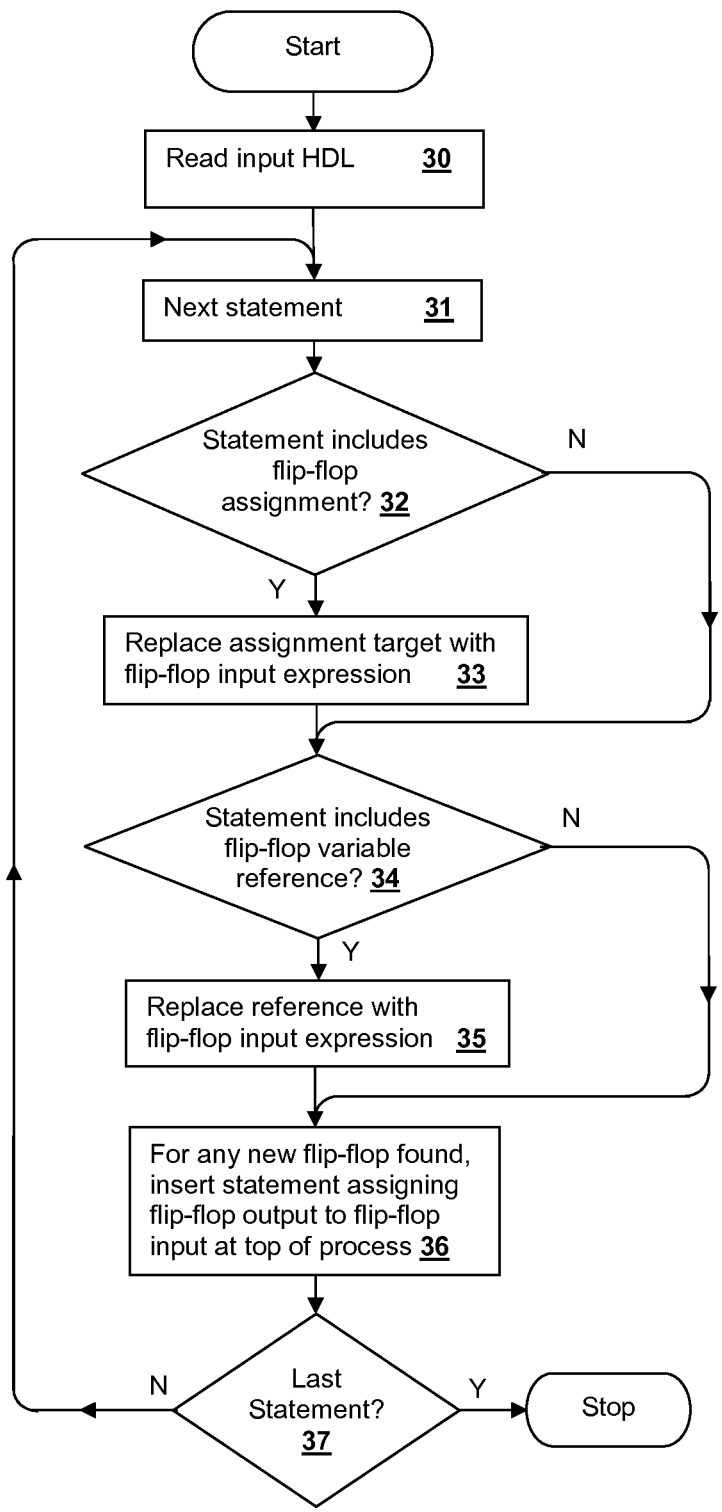
FIG. 3 is a flow chart depicting a method in accordance with an embodiment of the present invention.

Referring now to FIG. 3, a method of processing an HDL logic design is shown, according to an embodiment of the invention. The depicted method can be used to implement step 24 of the process depicted in FIG. 2 and transforms the input HDL containing storage element references and assignments to an output HDL having only combinational logic elements. The input HDL is read (step 30) and for each statement (step 31) if the statement includes an assignment to a flip-flop variable or signal (decision 32), the target of the assignment is replaced with the expression that determines the flip-flop's input (step 33). If the statement includes a reference to a flip-flop variable (decision 34) then the reference is also replaced with the expression that determines the flip-flop's input (step 35). Otherwise, if a flip-flop is not specified in the statement, or a reference is made to a flip-flop variable, then no change is made to the statement. Finally, for any new flip-flop that is encountered (by reference or assignment), a statement is inserted at the beginning of the process that assigns the value of the flip-flop output to the flip-flop input (step 36), ensuring that the value of a flip-flop signal or variable retains state unless the combinational process changes that state in a subsequent statement. Until the last statement is processed (decision 37), the process of steps 31-37 is repeated.

Figure 4:
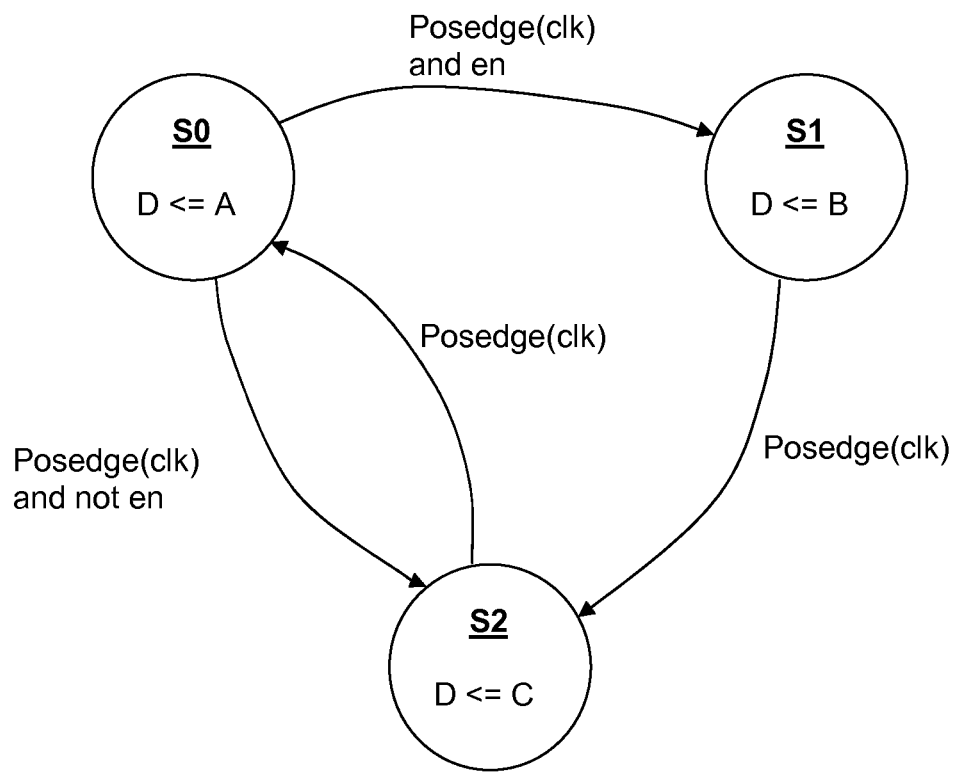
FIG. 4 is a state diagram illustrating an exemplary process that can be separated into a combinatorial and sequential process by a method, system and computer program in accordance with embodiments of the present invention.

Referring now to FIG. 4, an exemplary state diagram is shown that, when coded in an behavioral model HDL, may be expressed in a finite state machine model (FSM) as produced by processing performed according to embodiments of the present invention. A behavioral process statement in VHDL, corresponding to the state diagram of FIG. 4, is provided in the following code:

```
architecture a1 of e1 is
    type state is (S0, S1, S2); // enumeration type representing states
    signal current_state, next_state: state;
Begin
    -- Sequential process
    process (clk)
    begin
        if (clk = '1' and clk'event) then
            current_state <= next state;
        end if;
    end process;
    -- Combination process
    process (All)
        begin
            case current_state is
            when S0 => D <= A;
                        if (en = '1') then
                            next_state <= S1;
                        else
                            next_state <= S2;
                        end if;
            when S1 => D <= B;
                        next_state <= S2;
            when S2 => D <= C;
                        next_state <= S0;
        end process;
end;
```

In the example given above, the sequential process is expressed separately from the combination process. The combination process has no clocking or asynchronous set/reset inputs, and the sequential process only describes transitions between states caused by the clocking and/or set/reset inputs. Such a model is frequently used to input finite state machine (FSM) descriptions of circuits. The present invention provides an algorithm to convert generalized HDL behavior descriptions into FSM descriptions of the form given above.

A generalized example of an HDL code that expresses combined sequential and combinatorial behavior is given below, and will be used to illustrate the techniques of the present invention:

signal clk, cond1, cond2, a,b,c,d, reset: std_ulogic;
   signal r, r2, r3: std_ulogic
p0: process(clk,reset)
   variable x: std_ulogic;
   begin
   if (reset='1') then
   r<='0';
   elsif (clk='1' and clk'event) then
   if cond1='1' then
      r3<=a;
      x:=a or b;
      end if;
   r<=x;
   if cond2='1' then
      x:=c and d;
   end if;
   r2<=r3 and x;
   end if;
   end process;

Using an embodiment of the present invention, the above VDHL example code can be converted to an FSM model containing separate combinatorial and sequential processes, as seen below. A sequential process having only variables r, r2 and r3 corresponding to states and that receives flip-flop input signals r_in, r2_in, r3_in and a clock clk is given by the following code:

```
signal r_in, r2_in, r3_in: std_ulogic;
signal \p0.x\: std_ulogic;
signal x_sig_in: std_ulogic;
process(reset,clk)
   begin
   if (reset='1') then
      r<='0';
   elsif (clk='1' and clk'event) then
      r<=r_in;
      r2<=r2_in;
      r3<=r3_in;
      \p0.x\<=x_sig_in;
   end if;
end process;
```

Each of the flip-flops expressed in the above HDL code has a value set by an assigned input variable that is manipulated by the same clocking and/or other asynchronous set/reset controls that were present in the input HDL. The following HDL code represents the combination process extracted from the generalized input code given above, according to the process depicted in FIG. 2 and FIG. 3, which contains no state-retaining elements:

```
p0: process(All)
   variable x_in_var: std_ulogic;
begin
   x_in_var:=\p0.x\;
   r3_in<=r3;
   if cond1='1' then
      r3_in<=a;
      x_in_var:=a or b;
   end if;
   r_in<=x_in_var;
   if cond2='1' then
      x_in_var:=c and d;
   end if;
   r2_in<=r3 and x_in_var;
   x_sig_in<=x_in_var;
end process
```

Variable x, which was an inferred flip-flop variable in the input HDL code, has been replaced in the combinational process by a variable describing the input to that flip-flop, which is assigned a value equal to the output of the flip-flop p0.x at the beginning of the sequential process. The variable name x is tagged with the sequential process name p0 to distinguish the signal p0.x from local variable x in the input HDL, which might have naming collisions with other local variables in the source HDL.

Figure 5:
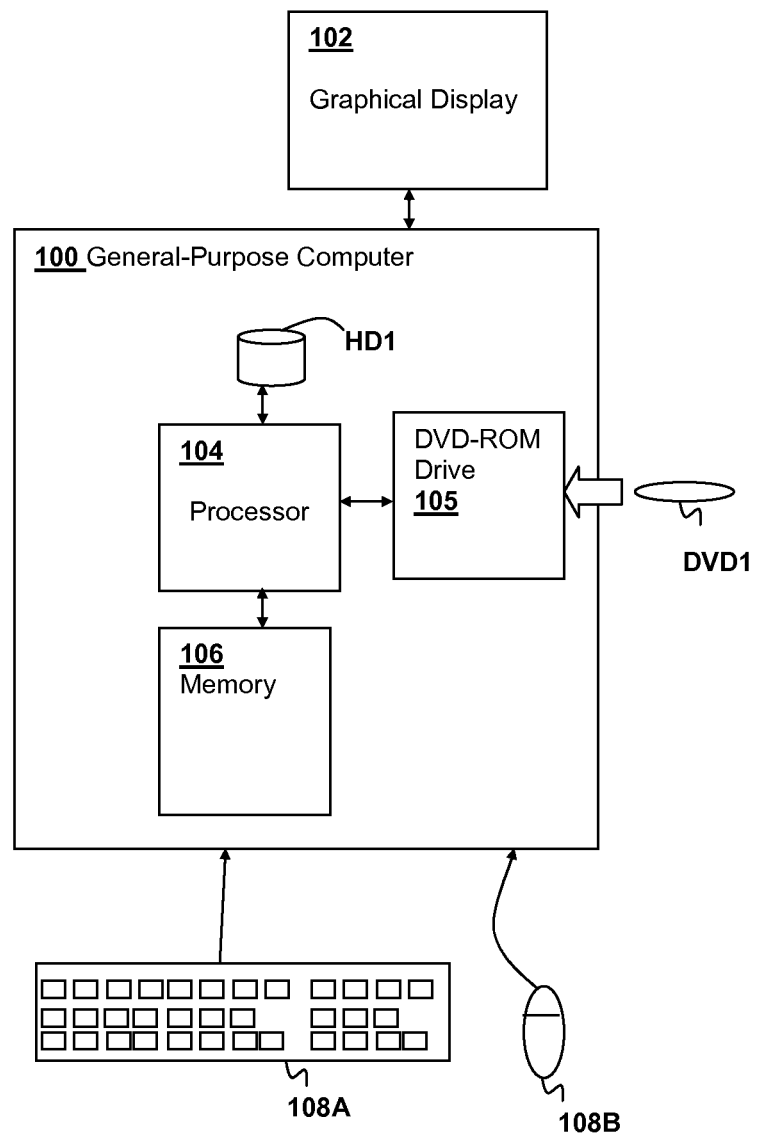
FIG. 5 is a block diagram illustrating a computer system in which program code according to an embodiment of the present invention implementing a method according to an embodiment of the invention is executed.

Referring now to FIG. 5, a computer system in which the above-described computer-performed methods are performed, is shown. A general-purpose computer 100 is coupled to a graphical display 102 for display of simulation and verification results, as well as user interface screens for controlling one or more programs including programs forming computer program products including program instructions for carrying out the methods described above. Input devices such as a keyboard 108A and a mouse 108B provide for user interaction with general-purpose computer 100. General-purpose computer 100 includes a processor 104 for executing program instructions stored in a memory 106 including program instructions forming the above-described computer program products in accordance with embodiments of the invention. A removable storage device, such as a DVD-ROM drive 105 is included for accepting storage media such as DVD-ROM DVD1 forming a computer program product in accordance with an embodiment of the invention. The computer system depicted in FIG. 5 is only one example of a computer system such as a desktop computer system or a notebook computer system that can be used to perform the simulations and verification described above. Other types of computer systems, including distributed and networked computer systems in which some or all of the algorithms and portions thereof are executed remotely are within the scope of the invention as contemplated herein, and the system depicted in FIG. 5 should not be construed as limiting the type of computer system or computer program products that form embodiments of the present invention.

As noted above, portions of the present invention may be embodied in a computer program product, which may include firmware, an image in system memory or another memory/cache, or stored on a fixed or re-writable media such as an optical disc having computer-readable code stored thereon. Any combination of one or more computer readable medium(s) may store a program in accordance with an embodiment of the invention. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

In the context of the present application, a computer readable storage medium may be any tangible medium that can contain, or store a program for use by or in connection with an instruction execution system, apparatus, or device. A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A computer-performed method performed by a general-purpose computer system that synthesizes a logic design, the method comprising:
   modeling the logic design as first hardware description language code within the computer system;
   the computer system automatically separating the logic design into a combinational logic design represented by second hardware description language code and a sequential logic design represented by third hardware description language code, wherein all state retaining elements of the logic design are included in the third hardware description language code;
  mapping the state retaining elements of the logic design from the third hardware description language code to library elements; and
  synthesizing the logic design from the second hardware description language code, the third hardware description language code and a result of the mapping.

2. The computer-performed method of claim 1, wherein the automatically separating moves clocking, asynchronous set and asynchronous reset conditions applied to the state retaining elements of the design into the third hardware description language code.

3. The computer-performed method of claim 1, further comprising connecting the second hardware description language code and the third hardware description language code by introducing signals to represent values of the state retaining elements of the logic design.

4. The computer-performed method of claim 3, wherein the separating further comprises:
  detecting a first statement containing a flip-flop signal in the first hardware description language code;
  responsive to detecting the first statement, determining whether or not the flip-flop signal is the target of an assignment or is referenced in the statement;
  responsive to determining that the flip-flop signal is the target of the assignment, inserting a second statement replacing the value of the flip-flop signal with an input value of the flip-flop in the second hardware description language code; and
  responsive to determining that the flip-flop signal is referenced, inserting a third statement leaving the reference to the flip-flop signal unchanged in the second hardware description language code.

5. The computer-performed method of claim 4, further comprising responsive to detecting the first statement, determining whether or not the input value of the flip-flop signal is inferenced as a latch, and responsive to determining that the input value of the flip-flop signal is inferenced as a latch, inserting a fourth statement assigning a value of the flip-flop signal to the input value of the flip-flop signal in the second hardware description language code at the beginning of a corresponding process.

6. The computer-performed method of claim 3, wherein the separating further comprises:
  detecting a first statement containing a flip-flop variable in the first hardware description language code;
  responsive to detecting the first statement, inserting a second statement introducing a new signal into the second hardware description language code, wherein the second statement assigns a value equal to a value of an input of the flip-flop to the new signal; and
  responsive to detecting the first statement, inserting a third statement replacing the value of the flip-flop variable with an input value of the flip-flop variable in the second hardware description language code.

7. The computer-performed method of claim 6, further comprising responsive to detecting the first statement, determining whether or not the input value of the flip-flop variable is inferenced as a latch, and responsive to determining that the input value of the flip-flop variable is inferenced as a latch, inserting a fourth statement assigning a value of the flip-flop variable to the input value of the flip-flop variable in the second hardware description language code at the beginning of a corresponding process.

8. A computer system comprising:
  a processor for executing program instructions;
  a storage for storing the program instructions, wherein the program instructions are program instructions for synthesizing a logic design, wherein the program instructions comprise program instructions for modeling the logic design as first hardware description language code within the computer system, automatically separating the logic design into a combinational logic design represented by second hardware description language code and a sequential logic design represented by third hardware description language code, wherein all state retaining elements of the logic design are included in the third hardware description language code, mapping the state retaining elements of the logic design from the third hardware description language code to library elements, and synthesizing the logic design from the second hardware description language code, the third hardware description language code and a result of the mapping.

9. The computer system of claim 8, wherein the program instructions for automatically separating move clocking, asynchronous set and asynchronous reset conditions applied to the state retaining elements of the design into the third hardware description language code.

10. The computer system of claim 8, wherein the program instructions further comprise program instructions for connecting the second hardware description language code and the third hardware description language code by introducing signals to represent values of the state retaining elements of the logic design.

11. The computer system of claim 10, wherein the program instructions for separating further comprise program instructions for:
  detecting a first statement containing a flip-flop signal in the first hardware description language code;
  responsive to detecting the first statement, determining whether or not the flip-flop signal is the target of an assignment or is referenced in the statement;
  responsive to determining that the flip-flop signal is the target of the assignment, inserting a second statement replacing the value of the flip-flop signal with an input value of the flip-flop in the second hardware description language code; and
  responsive to determining that the flip-flop signal is referenced, inserting a third statement leaving the reference to the flip-flop signal unchanged in the second hardware description language code.

12. The computer system of claim 11, wherein the program instructions further comprise program instructions for responsive to detecting the first statement, determining whether or not the input value of the flip-flop signal is inferenced as a latch, and responsive to determining that the input value of the flip-flop signal is inferenced as a latch, inserting a fourth statement assigning a value of the flip-flop signal to the input value of the flip-flop signal in the second hardware description language code at the beginning of a corresponding process.

13. The computer system of claim 10, wherein the program instructions for separating further comprise program instructions for:
  detecting a first statement containing a flip-flop variable in the first hardware description language code;
  responsive to detecting the first statement, inserting a second statement introducing a new signal into the second hardware description language code, wherein the second statement assigns a value equal to a value of an input of the flip-flop to the new signal; and responsive to detecting the first statement, inserting a third statement replacing the value of the flip-flop variable with an input value of the flip-flop variable in the second hardware description language code.

14. The computer system of claim 13, wherein the program instructions further comprise program instructions for responsive to detecting the first statement, determining whether or not the input value of the flip-flop variable is inferenced as a latch, and responsive to determining that the input value of the flip-flop variable is inferenced as a latch, inserting a fourth statement assigning a value of the flip-flop variable to the input value of the flip-flop variable in the second hardware description language code at the beginning of a corresponding process.

15. A computer program product comprising a computer-readable storage medium encoding program instructions for execution by a computer system, wherein the program instructions are program instructions for synthesizing a logic design, wherein the program instructions comprise program instructions for:

modeling the logic design as first hardware description language code within the computer system;

the computer system automatically separating the logic design into a combinational logic design represented by second hardware description language code and a sequential logic design represented by third hardware description language code, wherein all state retaining elements of the logic design are included in the third hardware description language code;

mapping the state retaining elements of the logic design from the third hardware description language code to library elements; and synthesizing the logic design from the second hardware description language code, the third hardware description language code and a result of the mapping.

16. The computer program product of claim 15, wherein the program instructions for automatically separating move clocking, asynchronous set and asynchronous reset conditions applied to the state retaining elements of the design into the third hardware description language code.

17. The computer program product of claim 15, wherein the program instructions further comprise program instructions for connecting the second hardware description language code and the third hardware description language code by introducing signals to represent values of the state retaining elements of the logic design.

18. The computer program product of claim 17, wherein the program instructions for separating further comprise program instructions for:

detecting a first statement containing a flip-flop signal in the first hardware description language code;

responsive to detecting the first statement, determining whether or not the flip-flop signal is the target of an assignment or is referenced in the statement;

responsive to determining that the flip-flop signal is the target of the assignment, inserting a second statement replacing the value of the flip-flop signal with an input value of the flip-flop in the second hardware description language code; and responsive to determining that the flip-flop signal is referenced, inserting a third statement leaving the reference to the flip-flop signal unchanged in the second hardware description language code.

19. The computer program product of claim 18, wherein the program instructions further comprise program instructions for responsive to detecting the first statement, determining whether or not the input value of the flip-flop signal is inferenced as a latch, and responsive to determining that the input value of the flip-flop signal is inferenced as a latch, inserting a fourth statement assigning a value of the flip-flop signal to the input value of the flip-flop signal in the second hardware description language code at the beginning of a corresponding process.

20. The computer program product of claim 17, wherein the program instructions for separating further comprise program instructions for:

detecting a first statement containing a flip-flop variable in the first hardware description language code;

responsive to detecting the first statement, inserting a second statement introducing a new signal into the second hardware description language code, wherein the second statement assigns a value equal to a value of an input of the flip-flop to the new signal; and responsive to detecting the first statement, inserting a third statement replacing the value of the flip-flop variable with an input value of the flip-flop variable in the second hardware description language code.

21. The program product of claim 20, wherein the program instructions further comprise program instructions for responsive to detecting the first statement, determining whether or not the input value of the flip-flop variable is inferenced as a latch, and responsive to determining that the input value of the flip-flop variable is inferenced as a latch, inserting a fourth statement assigning a value of the flip-flop variable to the input value of the flip-flop variable in the second hardware description language code at the beginning of a corresponding process.

* * * * *